United States Patent
Chazan et al.

(10) Patent No.: US 7,351,377 B2
(45) Date of Patent: Apr. 1, 2008

(54) METHODS AND DEVICES FOR ENHANCING BONDED SUBSTRATE YIELDS AND REGULATING TEMPERATURE

(75) Inventors: David Chazan, Palo Alto, CA (US);
Luc J. Bousse, Los Altos, CA (US);
Carlton Brooks, Menlo Park, CA (US);
Derek Louch, S.W. Calgary (CA);
Michael R. Spaid, Sunnyvale, CA (US)

(73) Assignee: Caliper Life Sciences, Inc., Mountain View, CA (US)

( * ) Notice: Subject to any disclaimer, the term of this patent is extended or adjusted under 35 U.S.C. 154(b) by 554 days.

(21) Appl. No.: 09/884,429

(22) Filed: Jun. 18, 2001

(65) Prior Publication Data

US 2002/0025280 A1    Feb. 28, 2002

Related U.S. Application Data

(60) Provisional application No. 60/212,701, filed on Jun. 19, 2000.

(51) Int. Cl.
*B01L 3/02* (2006.01)
*G01L 21/00* (2006.01)

(52) U.S. Cl. .................... 422/100; 422/99; 422/102; 422/58

(58) Field of Classification Search ............ 422/99, 422/100, 102, 58
See application file for complete search history.

(56) References Cited

U.S. PATENT DOCUMENTS

| | | | | |
|---|---|---|---|---|
| 4,343,015 A | * | 8/1982 | Baliga et al. | 257/267 |
| 4,891,120 A | * | 1/1990 | Sethi et al. | 204/600 |
| 5,225,163 A | * | 7/1993 | Andrews | 422/61 |
| 5,426,400 A | * | 6/1995 | Ho et al. | 333/26 |
| 5,800,785 A | * | 9/1998 | Bochner | 422/101 |
| 5,922,591 A | * | 7/1999 | Anderson et al. | 435/287.2 |
| 6,130,098 A | * | 10/2000 | Handique et al. | 436/180 |
| 6,375,899 B1 | * | 4/2002 | Ackley et al. | 422/68.1 |
| 6,447,727 B1 | * | 9/2002 | Parce et al. | 422/100 |
| 6,451,264 B1 | * | 9/2002 | Bhullar et al. | 422/100 |
| 6,465,257 B1 | * | 10/2002 | Parce et al. | 436/180 |
| 6,485,690 B1 | * | 11/2002 | Pfost et al. | 422/102 |
| 6,517,781 B1 | * | 2/2003 | Coassin et al. | 422/102 |
| 6,540,896 B1 | * | 4/2003 | Manz et al. | 204/451 |
| 6,552,784 B1 | * | 4/2003 | Dietz et al. | 356/246 |
| 6,596,237 B1 | * | 7/2003 | Borrelli et al. | 422/100 |
| 6,599,736 B2 | * | 7/2003 | McCaskill et al. | 435/288.5 |
| 6,627,406 B1 | * | 9/2003 | Singh et al. | 435/7.1 |
| 6,743,399 B1 | * | 6/2004 | Weigl et al. | 422/102 |
| 6,756,019 B1 | * | 6/2004 | Dubrow et al. | 422/102 |
| 6,776,965 B2 | * | 8/2004 | Wyzgol et al. | 422/100 |
| 6,878,271 B2 | * | 4/2005 | Gilbert et al. | 210/321.61 |
| 7,033,840 B1 | * | 4/2006 | Tagge et al. | 436/147 |
| 7,097,811 B2 | * | 8/2006 | Yao et al. | 422/100 |
| 2002/0127149 A1 | * | 9/2002 | Dubrow et al. | 422/102 |
| 2002/0179445 A1 | * | 12/2002 | Alajoki et al. | 204/451 |
| 2003/0124736 A1 | * | 7/2003 | Manz et al. | 436/180 |
| 2007/0202015 A1 | * | 8/2007 | Bousse et al. | 422/100 |

* cited by examiner

*Primary Examiner*—Brian R. Gordon
(74) *Attorney, Agent, or Firm*—Ann C. Petersen; Donald R. Mckenna

(57) ABSTRACT

Methods and devices that include the use of venting elements for enhancing bonded substrate yields and regulating temperature. Venting elements are generally fabricated proximal to functionalized regions in substrate surfaces to prevent bond voids that form during bonding processes from affecting the functionalized regions. Venting elements generally include venting channels or networks of channels and/or venting cavities.

15 Claims, 9 Drawing Sheets

METHODS AND DEVICES FOR ENHANCING BONDED SUBSTRATE YIELDS AND REGULATING TEMPERATURE

CROSS-REFERENCES TO RELATED APPLICATIONS

Pursuant to 35 U.S.C. §§ 119 and/or 120, and any other applicable statute or rule, this application claims the benefit of and priority to U.S. Ser. No. 60/212,701, filed on Jun. 19, 2000, the disclosure of which is incorporated by reference.

COPYRIGHT NOTIFICATION

Pursuant to 37 C.F.R. §1.71(e), Applicants note that a portion of this disclosure contains material which is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

BACKGROUND OF THE INVENTION

The manufacture of microfabricated devices, such as integrated circuits, microprocessors, microfluidic components, among many others, can require very high levels of precision in all aspects of the fabrication process, in order to accurately and reliably produce the assorted microscale features of these devices. Many non-microscale devices similarly must be efficiently manufactured in order to achieve cost effectiveness.

The fabrication of many devices, whether microscale or non-microscale, often entails the bonding or laminating of two or more substrate layers, in order to produce the assembled device. While many bonding techniques are routinely utilized to mate or laminate multiple substrates together, these methods all suffer from a number of deficiencies. For example, silica-based substrates are often bonded together using thermal bonding techniques. However, in these thermal bonding methods, substrate yields are often less than ideal, as a result of uneven mating or inadequate contact between the substrate layers prior to the thermal bonding process. Similarly, in bonding semi-malleable substrates, these bond voids or variations in the contact between substrate layers, e.g., resulting from uneven application of pressure to the substrates, may adversely impact device performance. In particular, when a bond void coincides with, or otherwise adjoins, a microchannel or other desired cavity of a microfluidic device, it alters or interferes with fluid flow patterns within the device, which can bias assay results. Additionally, optimal semiconductor device function typically requires the interface between the semiconductor and heat sink to be free of unattached regions between semiconducting layers in order to properly minimize electrical resistance heating and to maximize the conduction of heat away from the layers. Further, the presence of voids in bonding between laminated optical surfaces also leads to the diminished utility of assorted ocular instrumentation. Many other manufacturing methods are also negatively impacted by the occurrence of bond voids.

Particular sources of bond voids in, e.g., microfluidic devices, include particles trapped between substrates during the bonding process. There are generally two types of particles that cause incomplete bonding in microfluidic devices. The first type includes glass, polymer, or other substrate fragments, e.g., that are generated as by-products during the fabrication of features, such as microchannels into the substrate surfaces. These "hard defects" remain throughout the fabrication process and act as spacers between substrate layers to create the unattached regions. The other type of particle is organic matter that typically decomposes during certain high temperature bonding techniques. Nonetheless, these organic materials or "soft defects" typically leave behind voids in the bond between substrate surfaces.

Many applications performed using various electronic, microfluidic, or other devices entail precise temperature control over selected device regions. For example, high-throughput is achieved in certain microfluidic assays such as the polymerase chain reaction (PCR) step in, e.g., single nucleotide polymorphism (SNP) genotyping, by performing multiple reactions simultaneously in parallel reaction channels of a given device. This typically requires temperature uniformity across the multiple channels. In many devices, however, significant amounts of heat are lost, e.g., to the surrounding substrate material. Heat lost in this manner generally results in unequal temperature distributions among channels, which thereby inhibits reaction specificity.

Accordingly, due to the cost of substrate materials, and the precise manufacturing requirements of many microscale and non-microscale devices generally, and microfluidic devices, particularly, it would be desirable to provide techniques for preventing bond voids from affecting functionalized or otherwise specified regions of bonded surfaces. It would also be desirable to selectively regulate temperature within many of these devices. The present invention provides these, and other features, which will become apparent upon complete review of the following.

SUMMARY OF THE INVENTION

The present invention is generally directed to improved methods and devices for manufacturing bonded substrates, and particularly, to improved methods and devices for bonding together microfabricated substrates in the manufacture of microfluidic devices, which prevent bond voids from affecting specified regions of bonded substrates. These improved methods and devices for bonding substrates are generally applicable to a number of fabrication processes, and are particularly well suited to the manufacture of microfluidic devices. In overview, the invention includes disposing venting elements in substrates to intercept bond voids that form during bonding processes and to direct those forming voids away from specified regions of the particular device.

In one aspect, the invention relates to a fabrication element that includes a body structure having a venting element disposed therein or at least partially therethrough. In certain embodiments, for example, the venting element is disposed completely through the body structure. However, prior to body structure fabrication, the body structure typically includes a first and a second substrate. The first and second substrates are generally substantially planar. Further, at least one of the first and second substrates includes the venting element or a portion thereof disposed thereon or therethrough. Additionally, one or more of the first and second substrates further optionally also include a channel network, a port, both, or portions thereof disposed thereon or therethrough. In certain embodiments, the venting element or the portion thereof is separate from (i.e., not in fluid communication with) any other components disposed thereon or therethrough. In other embodiments, the venting element or the portion thereof adjoins (i.e., fluidly communication with) one or more ports or one or more portions thereof disposed thereon or therethrough.

In one embodiment, after the substrates have been bonded, the body structure is optionally divided to form a plurality of body structures (e.g., in which each of the plurality of body structures is a microfluidic device). In general, mass production of body structures, e.g., in the form of fabrication elements, significantly enhances manufacturing throughput. For example, each of the plurality of body structures is optionally formed by cutting, scoring, breaking, or etching the body structure.

Among the advantages of the present invention is that the venting element thermally insulates at least a first portion of the body structure from at least a second portion of the body structure, which reduces thermal coupling between the first and second portions. In certain embodiments, for example, the venting element is disposed in the body structure and produces a stagnant vapor region that reduces convective transport between venting element surfaces. In embodiments where the venting element is disposed at least partially through the body structure, at least one surface of the body structure optionally further includes at least one substrate disposed over at least a segment of the venting element to produce a stagnant vapor region that reduces convective transport between venting element surfaces.

In preferred embodiments, at least one of the first and second portions further includes at least one cavity disposed therein, such as, when the body structure includes at least one microfluidic device. Optionally, the at least one cavity includes a plurality of cavities in which at least two adjacent cavities include one or more venting elements disposed therebetween. In certain embodiments, one or more electrodes are disposed in or proximal to the at least one cavity. In these embodiments, an electrical power supply is typically operably connected to the one or more electrodes to deliver current to fluidic materials disposed in the at least one cavity, which current resistively heats the fluidic materials. For example, the fluidic materials optionally include nucleic acids and resistive heat denatures the nucleic acids. The venting element is optionally separate from (i.e., not in fluid communication with) the cavity or any other component disposed within or through at least a portion of the body structure. In these embodiments, the body structure also typically includes ports, capillary elements, or both, in fluid communication with the cavity (e.g., a microchannel network). Optionally, the venting element is in fluid communication with at least one port disposed in the body structure, which port is separate from (i.e., not in fluid communication with) the cavity.

The present invention also includes methods of fabricating a body structure. The methods include forming at least a first and a second substrate in which at least one of the first and second substrates includes at least one venting element, or a portion of a venting element, disposed thereon or therethrough. The methods also include bonding the first and second substrates together to form the body structure. Additionally, the methods typically include providing the first and second substrates to be substantially planar and the bonding step to comprise heat laminating, adhering, welding, or clamping the first and second substrates together to form the body structure. As indicated, in certain embodiments the methods additionally include dividing the body structure to form a plurality of body structures (e.g., in which each is a microfluidic device). The body structure is optionally divided by cutting, scoring, breaking, or etching the body structure.

One advantage of the invention is that the venting element thermally insulates at least a first portion of the body structure from at least a second portion of the body structure, which reduces thermal coupling between the first and second portions. In certain embodiments the venting element is disposed in the body structure and produces a stagnant vapor region that reduces convective transport between venting element surfaces. As described above, the body structure optionally includes the venting element disposed at least partially therethrough (e.g., completely through the body structure). In these embodiments, the method optionally further includes bonding at least one additional substrate over at least a segment of the venting element to produce a stagnant vapor region that reduces convective transport between venting element surfaces. In preferred embodiments, at least one of the first and second portions further includes at least one cavity disposed therein. Optionally, the at least one cavity includes a plurality of cavities in which at least two adjacent cavities include one or more venting elements disposed therebetween.

As mentioned, although the methods of the invention are applicable to a wide array of manufacturing processes, in preferred embodiments the body structure comprises at least one microfluidic device. In these embodiments, the at least one of the first and second substrates typically also includes at least one cavity, or a portion thereof, disposed thereon. The methods also generally include fabricating one or more ports through at least one of the first or second substrates such that at least one of the one or more ports fluidly communicates with the at least one cavity. Optionally, the methods include fabricating one or more ports through at least one of the first or second substrates such that at least one of the one or more ports fluidly communicates with the at least one venting element (i.e., not in fluid communication the at least one cavity), e.g., to vent bond voids from the at least one venting element through the one or more ports during substrate bonding.

The methods optionally include fabricating the at least one venting element to include at least one venting channel network, a plurality of venting cavities, or both. Optionally, the methods include fabricating each of the plurality of venting cavities to include regularly or irregularly shaped cavities, each cavity including three dimensions, in which two of the three dimensions together form a shape that includes a triangle, a square, a rectangle, a trapezoid, a regular n-sided polygon, an irregular nsided polygon, a circle, an oval, or the like. Each of the plurality of venting cavities is optionally fabricated at regular or irregular intervals (e.g., at least about 10 µm) from one another.

In embodiments where the body structure is a microfluidic device, the methods generally include fabricating the at least one cavity to include a microchannel network. In these embodiments, the at least one venting channel network typically includes a first venting channel network, at least one venting channel of which is disposed proximal to a first side of one or more microchannels in the microchannel network. The methods also optionally include fabricating a second venting channel network, at least one venting channel of which is disposed proximal to a second side of the one or more microchannels in the microchannel network. Typically, the at least one venting channel of the first and second venting channel networks are fabricated to be disposed substantially parallel to the one or more microchannels.

The methods of the present invention include fabricating the first and second venting channel networks in various alternative configurations. For example, the at least one venting channel of the first and second venting channel networks are typically fabricated to terminate at least about 0.05 mm (e.g., 0.1 mm, 0.3 mm, 0.5, mm, 1 mm, or more) from an edge of a port when the one or more microchannels fluidly communicate with the port. The methods also include fabricating the at least one venting channel of the first and second venting channel networks to each comprise a width of at least about 5 µm (e.g., 10 µm, 50 µm, 100 µm, or more). Optionally, the at least one venting channel of the first and second venting channel networks are fabricated to each include cross-sectional midpoints disposed at least about 60 µm from a cross-sectional midpoint of the one or more microchannels. The one or more microchannels are typically fabricated to include a width of at least about 60 µm. Furthermore, the methods optionally include merging two or more venting channels in the first or second venting channel networks in regions where cross-sectional midpoints of two or more venting channels are separated by less than about 50 µm.

In certain embodiments, the methods of the invention include fabricating a third venting channel network that includes one or more venting channels proximal to one or more edges of the body structure. The one or more venting channels typically include widths of at least about 0.1 mm. Additionally, the methods optionally include fabricating the one or more venting channels at least about 3 mm from the one or more edges of the body structure. In these embodiments, the one or more venting channels of the first and second venting channel networks are typically fabricated to be in fluid communication with the third venting channel network.

DETAILED DISCUSSION OF THE INVENTION

Figure 1:
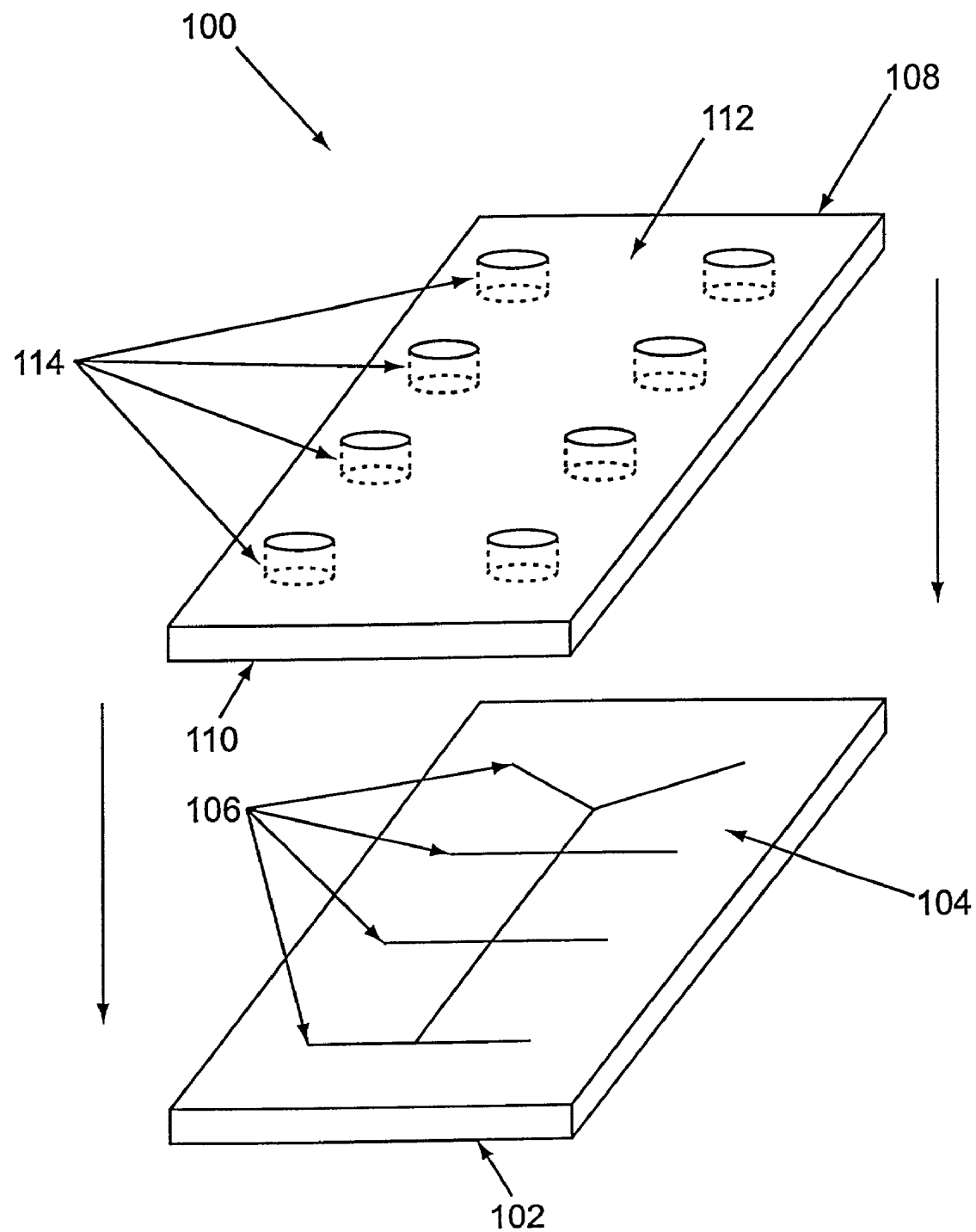
FIG. 1 schematically illustrates the layered fabrication of a typical microfluidic device that includes two separate substrates.

The present invention is directed to improved methods of manufacturing component substrates, and more particularly, to improved methods of bonding substrates together in the manufacture of various devices. These improved methods of bonding substrates are generally applicable to a number of microfabrication processes, and are particularly well suited to the manufacture of microfluidic devices. More specifically, the present invention may be utilized to prevent bond voids from affecting specified regions of bonded surfaces. The invention also relates to thermally insulating selected device regions.

As used herein, a "bond void" refers to a region between bonded surfaces in which the surfaces are unintentionally not attached, adhered, contacted, joined, or otherwise bonded together. These manufacturing defects, which are typically caused by particulate matter trapped between the bonded surfaces, inhibit the attainment of economies of scale in many different production processes. Thus, one significant advantage of the methods and devices of the present invention which effect bond void control is greater production efficiencies (e.g., higher yields of defect-free products, lower manufacturing costs, etc.).

In particular, the device body structures of the invention are typically fabricated by forming at least two mating substrates (e.g., planar substrates) in which at least one of those substrates includes one or more venting elements, or a portion of those elements, disposed on a surface. Thereafter, those surfaces are bonded together to form the particular device body structure. Alternatively, more than two planar substrates, whose surfaces optionally include venting elements or portions of those elements, are fabricated and bonded together. As used herein, a "venting element" refers to an element (e.g., a bond void venting element), such as a cavity, a channel, or other functionally equivalent feature, which intercepts bond voids that form between substrate surfaces during bonding processes to prevent such bond voids from affecting specified regions on the substrate surfaces by directing the forming voids away from those regions. The specified regions typically include functional regions or elements of a particular device body structure, or of pre-assembled device body structure components (e.g., substrates or the like) that include the functional elements. For example, functional elements of microfluidic devices typically include microchannel networks or other microscale chambers. In certain microelectronic devices, functional elements typically include transistors, diodes, capacitors, resistors, interconnection therebetween, or the like. Venting elements (e.g., venting cavities, venting channels, or the like) are generally disposed proximal to the functional regions of the body structure to be protected from bond voids during the manufacturing process. Venting elements additionally thermally insulate regions or zones of devices in or through which they are disposed, e.g., by reducing the lateral flow of heat therein.

The conditions under which substrates are bonded together are generally widely understood, and such bonding of substrates is generally carried out by any of a number of methods, which typically vary depending upon the nature of the substrate materials used. For example, thermal bonding of substrates is optionally applied to a number of substrate materials, including, e.g., glass or silica-based substrates, as well as polymer based substrates. Such thermal bonding typically includes mating together the substrates that are to be bonded, under conditions of elevated temperature and, in some cases, application of external pressure. The precise temperatures and pressures will generally vary depending upon the nature of the substrate materials used.

For example, for silica-based substrate materials, i.e., glass (borosilicate glass, Pyrex™, soda lime glass, etc.), quartz, and the like, thermal bonding of substrates is typically carried out at temperatures ranging from about 500° C. to about 1400° C., and preferably, from about 500° C. to about 1200° C. For example, soda lime glass is typically bonded at temperatures around 550° C., whereas borosilicate glass typically is thermally bonded at or near 800° C.

Quartz substrates, on the other hand, are typically thermally bonded at temperatures at or near 1200° C. These bonding temperatures are typically achieved by placing the substrates to be bonded into high temperature annealing ovens. These ovens are generally commercially available from, e.g., Fischer Scientific, Inc. and LabLine, Inc., among others.

Polymeric substrates that are thermally bonded, on the other hand, typically utilize lower temperatures and/or pressures than silica-based substrates, in order to prevent excessive melting of the substrates and/or distortion, e.g., flattening of the interior portion of the device, i.e., channels or chambers. Generally, such elevated temperatures for bonding polymeric substrates vary from about 80° C. to about 200° C., depending upon the polymeric material used, and will preferably be between about 90° C. and 150° C. Because of the significantly reduced temperatures required for bonding polymeric substrates, such bonding is typically carried out without the use of high temperature ovens, as used in the bonding of silica-based substrates. This allows incorporation of a heat source within a single integrated bonding system, as described in greater detail below.

Adhesives are also optionally used to bond substrates together according to well known methods, which typically include applying a layer of adhesive between the substrates that are to be bonded and pressing them together until the adhesive sets. A variety of adhesives are optionally used in accordance with these methods, including, e.g., UV curable adhesives, that are commercially available. Alternative methods are also optionally used to bond substrates together in accordance with the present invention, including e.g., acoustic or ultrasonic welding and/or solvent welding of polymeric parts.

Typically, a number of microfabricated devices are manufactured at a time, e.g., in the form of fabrication elements. As used herein, a "fabrication element" refers to a product (e.g., when a single device body structure is fabricated), or an intermediate (e.g., when multiple device body structures are fabricated initially as a single unit), of a technique in which two or more component surfaces are bonded together. For example, polymeric substrates are optionally stamped or molded in large separable sheets that are thereafter mated and bonded together to form an intermediate structure, which includes numerous discrete units once the fabrication element is segmented. Individual devices or bonded substrates are then separated from the larger intermediate sheet. Similarly, for silica-based substrates, individual devices are optionally fabricated from larger substrate wafers or plates, allowing higher throughput of the manufacturing process. Specifically, a number of channel structures are typically manufactured into a first substrate wafer or plate which is then overlaid with a second substrate wafer or plate. The resulting multiple devices are then segmented from the larger intermediate substrates or fabrication elements using known methods, such as sawing or cutting (see, e.g., U.S. Pat. No. 4,016,855 to Mimata, incorporated herein by reference), scoring and breaking (see, e.g., U.S. Pat. No. 5,945,334 to Besemer et al.), and the like.

FIG. 1 illustrates two layer body structure 100, for a microfluidic device. In preferred aspects, bottom portion 102 of the device comprises a solid substrate that is substantially planar in structure, and which has at least one substantially flat upper surface 104. A variety of substrate materials are optionally employed as the bottom portion. Typically, because the devices are microfabricated, substrate materials will be selected based upon their compatibility with known microfabrication techniques, e.g., photolithography, wet chemical etching, plasma etching, laser ablation, air abrasion techniques, LIGA, reactive ion etching, injection molding, embossing, and other techniques. The substrate materials are also generally selected for their compatibility with the full range of conditions to which the microfluidic devices may be exposed, including extremes of pH, temperature, electrolyte concentration, and application of electric fields. Accordingly, in some preferred aspects, the substrate materials optionally include materials normally associated with the semiconductor industry in which such microfabrication techniques are regularly employed, including, e.g., silica-based substrates (e.g., glass, quartz, or the like) and silicon-based substrates (e.g., polysilicon, etc.) as well as other substrate materials, such as gallium arsenide and the like. In the case of semiconductive materials, it will often be desirable to provide an insulating coating or layer, e.g., silicon oxide, over the substrate material, and particularly in those applications where electric fields are to be applied to the device or its contents.

In additional preferred aspects, the substrate materials will comprise polymeric materials, e.g., plastics, such as polymethylmethacrylate (PMMA), polycarbonate, polytetrafluoroethylene (TEFLON™), polyvinylchloride (PVC), polydimethylsiloxane (PDMS), polysulfone, polystyrene, polymethylpentene, polypropylene, polyethylene, polyvinylidine fluoride, acrylonitrile-butadiene-styrene copolymer (ABS), or the like. Such polymeric substrates are readily manufactured using available microfabrication techniques, as described above, or from microfabricated masters, using known molding techniques, such as injection molding, embossing or stamping, or by polymerizing the polymeric precursor material within the mold (see, e.g., U.S. Pat. No. 5,512,131). Such polymeric substrate materials are preferred for their ease of manufacture, low cost and disposability, as well as their general inertness to most extreme reaction conditions. Again, these polymeric materials optionally include treated surfaces, e.g., derivatized or coated surfaces, to enhance their utility in the microfluidic system, e.g., to provide enhanced fluid direction, e.g., as described in U.S. Pat. No. 5,885,470 (J. Wallace Parce et al.) issued Mar. 23, 1999, and which is incorporated herein by reference in its entirety for all purposes.

The channels and/or cavities of the microfluidic devices are typically fabricated into upper surface 104 of bottom substrate 102 of the device, as microscale grooves or indentations 106, using the above described microfabrication techniques. Although not shown, venting elements (e.g., venting channels, venting cavities, or the like), which are discussed in greater detail below, are also typically fabricated into upper surface 104 of bottom substrate or portion 102. Top portion or substrate 108 also includes first planar surface 110, and second surface 112 opposite first planar surface 110. In the microfluidic devices prepared in accordance with certain aspects of the methods described herein, top portion 108 optionally includes at least one aperture, hole or port 114 disposed therethrough, e.g., from first planar surface 110 to second surface 112 opposite first planar surface 110. In other embodiments, aperture, hole or port 114 is optionally omitted, e.g., where fluids are introduced solely through external capillary elements. Although not shown in FIG. 1, venting elements are also optionally fabricated into first planar surface 110 of top portion or substrate 108. Additionally, although described in terms of microscale grooves or indentations 106 fabricated into bottom substrate 102 and aperture, hole or port 114 disposed through top portion 108, it will be appreciated that these functional components could also have the opposite orientation, or both components could be fabricated in the same substrate. Other alternatives include fabricating both functional components in each substrate layer and/or including more than two substrate layers in a particular microfluidic device in which each layer includes ports and/or microscale indentations (e.g., microchannels, etc.).

Figure 2A:
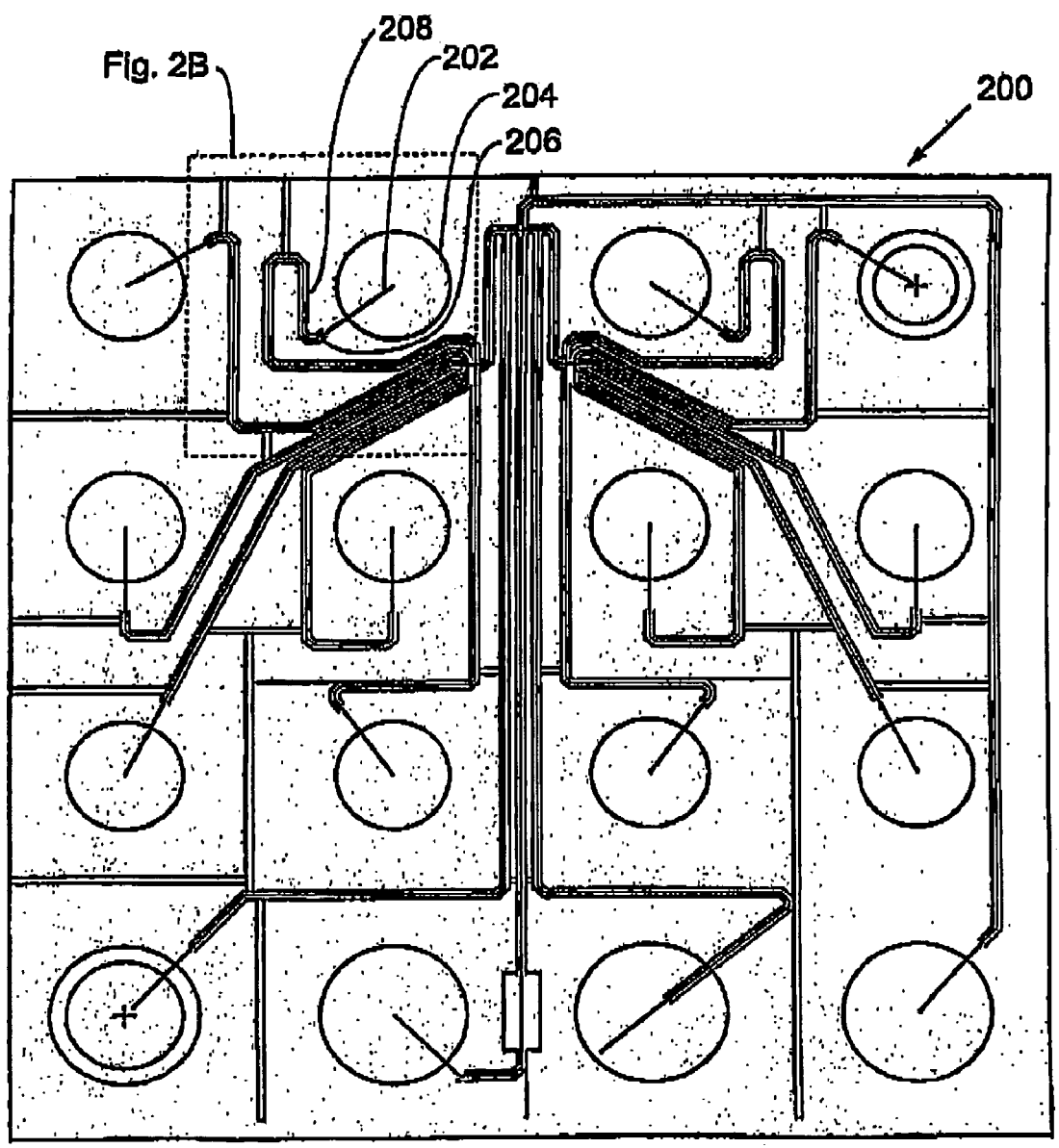
FIG. 2A schematically illustrates a microfluidic device body structure that includes venting channel networks.
Figure 2B:
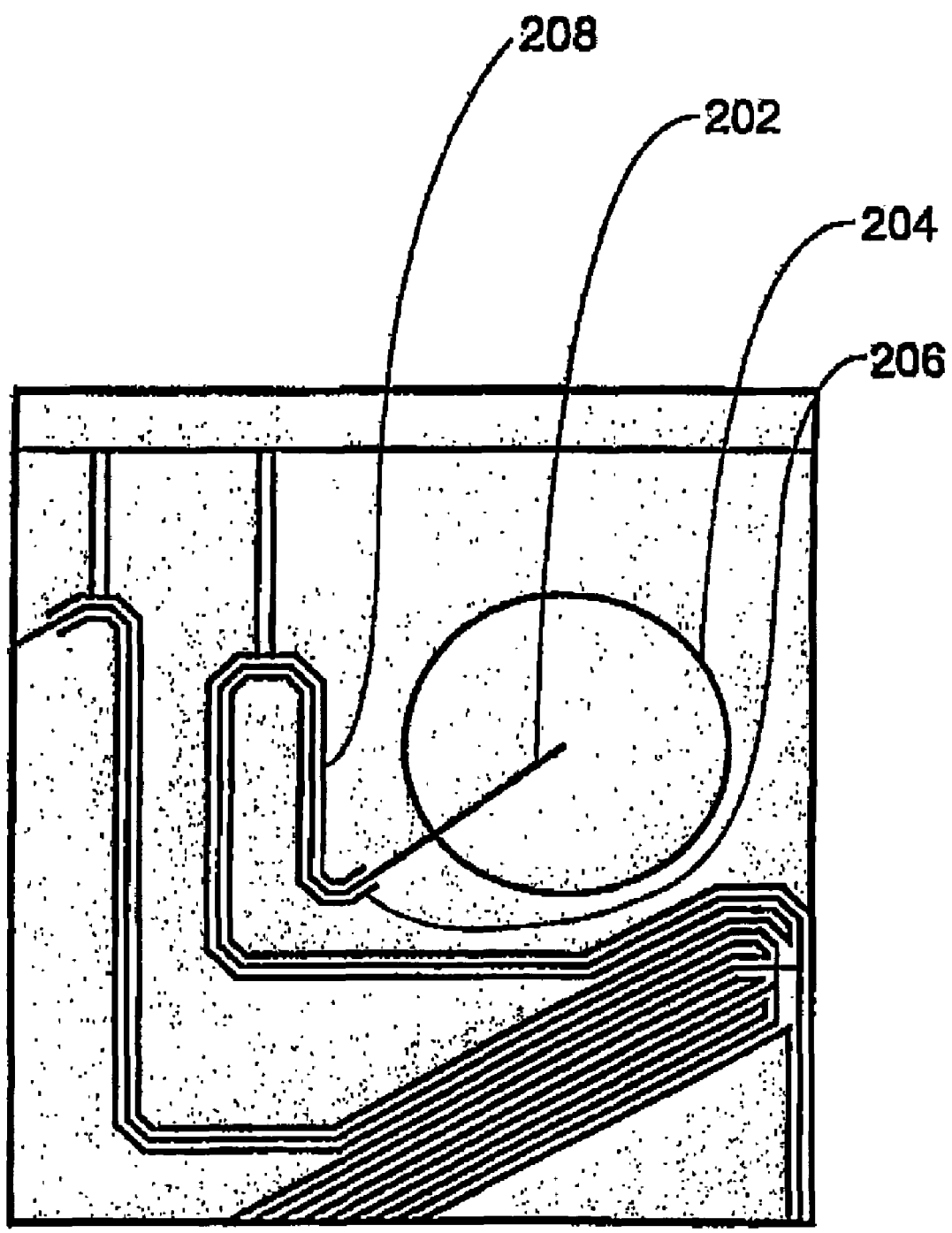
FIG. 2B schematically illustrates a magnified view of a portion of the microfluidic device body structure depicted in FIG. 2A.

As mentioned, the venting elements of the present invention typically include, e.g., venting channel networks, venting cavities, or both, fabricated in device body structures. In certain preferred embodiments, venting channels are disposed along at least a portion of and substantially parallel to one or more sides of one or more microchannels in microchannel networks fabricated in the body structures of the devices. This is further illustrated in FIG. 2A, where microfluidic device body structure 200 includes venting channel networks with venting channels disposed on two sides of each microchannel 202. FIG. 2B schematically illustrates a magnified view of a portion of the body structure depicted in FIG. 2A. In this example, a first venting channel network includes first venting channel 206 disposed proximal to a first side of microchannel 202 in the microchannel network. This embodiment also optionally includes a second venting channel network in which second venting channel 208 is disposed proximal to a second side of microchannel 202 of the microchannel network.

The first and second venting channel networks of microfluidic device body structure 200 include various alternative formats. For example, as shown in FIGS. 2A and 2B, first and second venting channel (206 and 208, respectively) of the first and second venting channel networks are optionally disposed substantially parallel to microchannel 202 in the microchannel network. Individual venting channels of the first and second venting channel networks optionally include widths of at least about 5 μm (e.g., 10 μm, 50 μm, 100 μm, or more). Additionally, the individual venting channels of the first and second venting channel networks typically terminate at least about 0.05 mm (e.g., 0.1 mm, 0.3 mm, 0.5, mm, 1 mm, or more) from an edge of port 204 when microchannel 202 in the microchannel network fluidly communicates with port 204. This prevents fluid flow into the venting channels during operation of the device. Although not shown in FIG. 2, venting channels optionally fluidly communicate with ports that are not in fluid communication with microchannel networks or other device cavities, e.g., to vent bond voids that form during substrate bonding. Also, two or more venting channels in the first or second venting channel networks typically merge in regions where cross-sectional midpoints of the two or more venting channels are separated by at most about 50 μm, e.g., to simplify the fabrication process. Furthermore, a cross-sectional midpoint of a venting channel is generally disposed at least about 60 μm from a cross-sectional midpoint of a microchannel in the microchannel network. The microchannels typically include a width of at least about 60 μm.

As indicated above, in certain embodiments, one or more edges of the body structure, or a fabrication element (discussed below) which includes a plurality of body structures prior to being divided, include a third venting channel network that includes one or more venting channels, which typically include widths of at least about 0.1 mm. For example, a venting channel of the third venting channel network generally includes a width in the range of from about 0.1 mm to about 3 mm (e.g., 0.2 mm, 0.23 mm, 0.3 mm, 0.35 mm, 0.5 mm, 1 mm, 2 mm, etc.). A venting channel of the third venting channel network is optionally disposed at least about 3 mm from the edges of the body structure. In these embodiments, one or more venting channels of the venting channel networks typically fluidly communicate with the third venting channel network to vent bond voids, that form during bonding steps, away from, e.g., microchannels or other functional regions of the device.

In some embodiments of the invention, device body structures are manufactured with venting cavities disposed therein. Although effective against bond voids caused by soft defects (e.g., various types of organic matter), this form of venting element is particularly effective against bond voids produced by hard defects, such as residual substrate materials (e.g., fragments of glass, plastic, or the like) left behind when microchannel networks or other cavities are fabricated in substrate surfaces prior to bonding, as described above.

Figure 3:
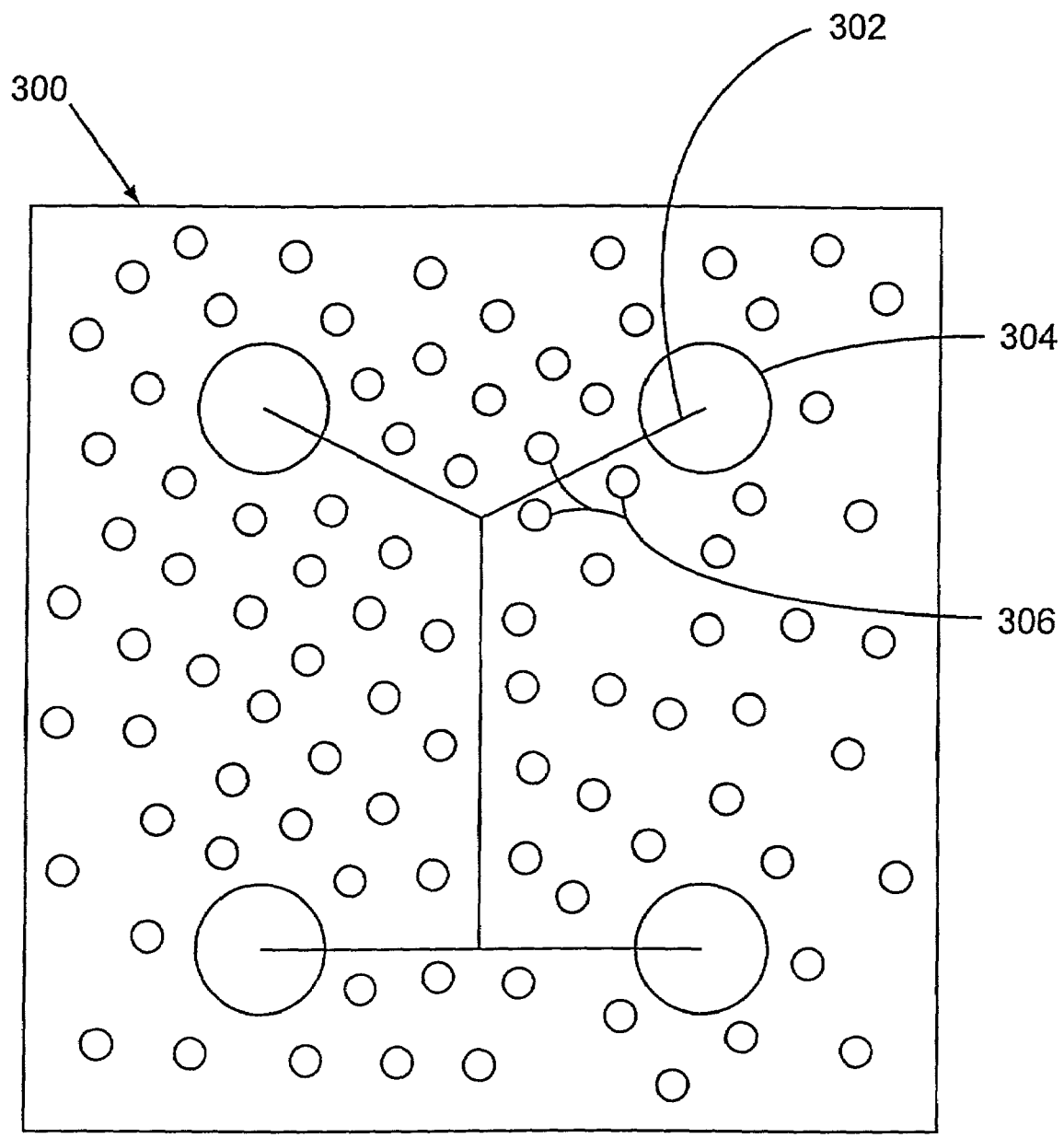
FIG. 3 schematically illustrates a microfluidic device body structure that includes venting cavities.

FIG. 3 schematically illustrates one microfluidic device embodiment that incorporates venting cavities. As shown, plurality of venting cavities 306 is disposed proximal to two sides of microchannel 302 which intersects with port 304 in microfluidic device body structure 300. Although depicted as regular shapes, each venting cavity is optionally irregularly shaped. Combinations of regular and irregular shapes are also possible. For example, two of the three venting cavity dimensions together optionally form shapes that include triangles, squares, rectangles, trapezoids, regular n-sided polygons, irregular n-sided polygons, circles, ovals, or the like. Venting cavities are typically fabricated with volumes of at least about 1 μm$^3$ (e.g., 50 μm$^3$, 100 μm$^3$, 500 μm$^3$, 1000 μm$^3$, or more). Additionally, venting cavities typically include a depth of at least about 0.1 μm (e.g., 1 μm, 10 μm, 100 μm, or more). Other alternatives include spacing each venting cavity at least about 10 μm from other venting cavities. Furthermore, venting cavities are optionally regularly or irregularly spaced from one another, and at least about 5 μm from an edge of a nearest microchannel, a nearest port, or other functional microfluidic device element.

It will be appreciated that, although venting elements (e.g., venting channel networks, venting cavities, etc.) are optionally fabricated for communication with the external environment (e.g., intersections with certain venting channels of the third venting channel network, intersections with ports that are not in fluid communication with other device cavities, or the like), they are also optionally fabricated for complete enclosure (i.e., inaccessible to the external environment) within bonded components (e.g., fabrication elements, individual body structures, or the like). For example, in pre-bonded substrates, venting channel networks are optionally disposed or positioned in a substrate surface such that they do not or will not (i.e., upon bonding) intersect with any other component (e.g., other venting channel networks, venting cavities, microchannels, ports, or the like) fabricated into the same surface, or a different substrate surface to be mated with the substrate surface. Venting cavities are similarly also optionally positioned in pre-bonded substrate surfaces. Upon bonding (discussed below), venting elements so positioned are completely sealed within the bonded structure. This is schematically illustrated by, e.g., plurality of venting cavities 306 shown in FIG. 3.

Figure 5:
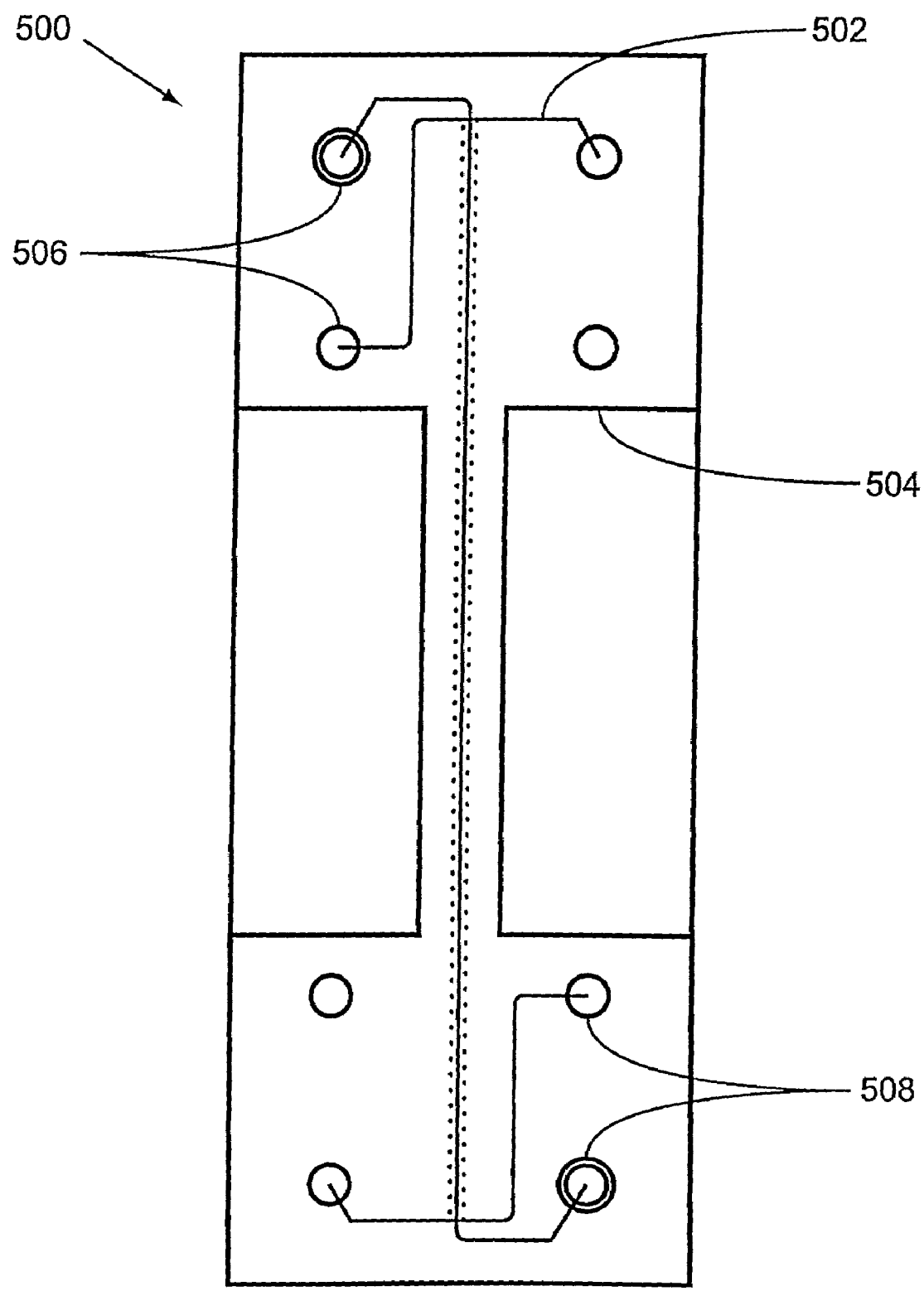
FIG. 5 schematically illustrates one microfluidic device body structure produced by severing it from the fabrication element depicted in FIG. 4.

As a further option, components, such as chambers, cavities, ports, or the like are fabricated through a substrate such that when the substrate is bonded to another substrate, they do not fluidly communicate with any elements (e.g., functional regions) disposed in the other substrate. In FIG. 5, this is depicted by, e.g., non-functional ports 508. Although not shown in FIG. 5, venting elements are optionally fabricated to fluidly communicate with such components.

After components such as ports, microchannels, venting elements, and the like have been fabricated, first planar surface 110 of top substrate 108 is then mated, e.g., placed into contact with, and bonded to planar surface 104 of bottom substrate 102, covering and sealing the grooves and/or indentations 106 in planar surface 104 of bottom substrate 102, to form the channels and/or chambers (i.e., the interior portion) of the device at the interface of these two components. (FIG. 1). Holes 114 in the top portion of the device are oriented such that they are in communication with at least one of the channels and/or chambers formed in the interior portion of the device from the grooves or indentations in the bottom substrate. In the completed device, these holes function as reservoirs for facilitating fluid or material introduction into the channels or chambers of the interior portion of the device, as well as providing ports at which electrodes may be placed into contact with fluids within the device, allowing application of electric fields along the channels of the device to control and direct fluid transport within the device.

Optionally, electrodes are disposed relative to the grooves and/or indentations in the surface of the bottom substrate before the top and bottom substrates are mated and bonded. As described further below, these electrode are used, e.g., to resistively heat fluidic materials disposed within device cavities. In certain embodiments, the electrodes or portions thereof are not covered by the top substrates. For example, a top substrate is optionally placed adjacent to an electrode disposed relative to the grooves and/or indentations in the surface of the bottom substrate. These electrodes are generally patterned metal layers of essentially any geometric shape. For example, portions of electrodes exposed to fluidic materials in device cavities typically include surface areas between about $1 \times 10^{-6}$ cm$^2$ and about $100 \times 10^{-4}$ cm$^2$. Additionally, at least segments of the electrodes optionally include an outer layer (e.g., platinum, etc.) disposed over an inner layer (e.g., a metal adhesion layer, such as titanium, tungsten, an alloy thereof, or the like). Incorporated electrodes typically include thicknesses of at most about 0.1 μm to properly form device cavities and to avoid the formation of bond voids upon substrate bonding. Techniques for fabricating electrodes suitable for the present invention are generally known.

Figure 4:
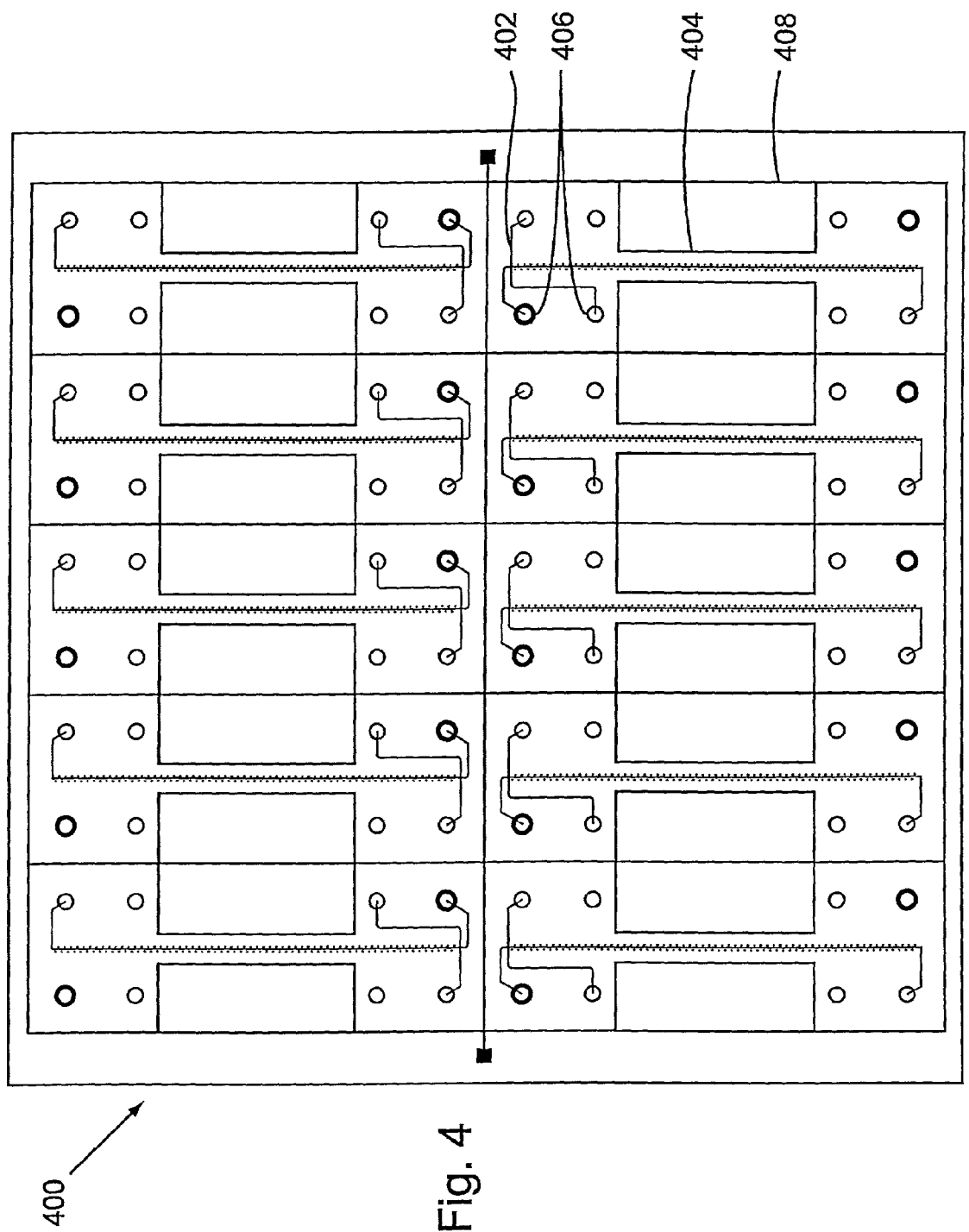
FIG. 4 schematically illustrates a fabrication element that includes multiple microfluidic body structures.

As mentioned above, multiple microfabricated devices are typically manufactured at the same time, such as in the form of fabrication elements. To further illustrate microfluidic device mass production, FIG. 4 depicts fabrication element 400, which includes multiple microfluidic device body structures. As shown, each body structure includes microchannel network 402, individual microchannels of which fluidly communicate with certain ports 406 disposed within fabrication element 400. Additionally, venting channel network 404 is also disposed proximal to at least portions of microchannel network 402. Edge or frame channel 408 (e.g., a venting channel of the third venting channel network) intersects with venting channel network 404 for venting bond voids, that form during the substrate bonding step, away from microchannel network 402. As mentioned, fabrication element 400 is optionally divided to form a plurality of microfluidic device body structures using techniques discussed above. FIG. 5 shows microfluidic device body structure 500 produced by severing it from fabrication element 400 depicted in FIG. 4. As shown, microfluidic device body structure 500 includes microchannel network 502, ports 506, and venting channel network 504. In the context of FIG. 4 and the above description, the venting channel networks protect individual discrete channel networks from bond voids, whereas frame channels protect multiple discrete channel networks from voids. However, as described herein, both structures are similar, if not identical in their basic structures and functions, e.g., venting channels to block or redirect bond voids, and can thus be interchangeably used.

As noted above, the top or second substrate is overlaid upon the bottom or first substrate to seal the various channels and chambers. In carrying out the bonding process according to preferred embodiments of the present invention, the mating of the first and second substrates is carried out using vacuum to maintain the two substrate surfaces in optimal contact, e.g., to minimize the occurrence of bond voids. However, as described herein, when bond voids do form, the presence of venting elements (e.g., venting channels, venting cavities, or the like) inhibits them from spreading into functionalized regions (e.g., regions having microchannels, etc.) of the devices. In particular, the bottom substrate is typically maintained in optimal contact with the top substrate by mating the planar surface of the bottom substrate with the planar surface of the top substrate, and applying a vacuum through the holes that are disposed through the top substrate. In addition, in one set of embodiments, a wicking agent (e.g., water or the like) is placed between the top and bottom substrate surfaces prior to application of the vacuum to assist in establishing optimal contact between the surfaces to be bonded. Typically, application of a vacuum to the holes in the top substrate is carried out by placing the top substrate on a vacuum chuck, which typically comprises a mounting table or surface, having an integrated vacuum source. In the case of silica-based substrates, the mated substrates are optionally subjected to elevated temperatures, e.g., in the range of from about 100° C. to about 200° C., in order to create an initial bond, so that the mated substrates may then be transferred to an annealing oven, without any shifting relative to each other.

Figure 6:
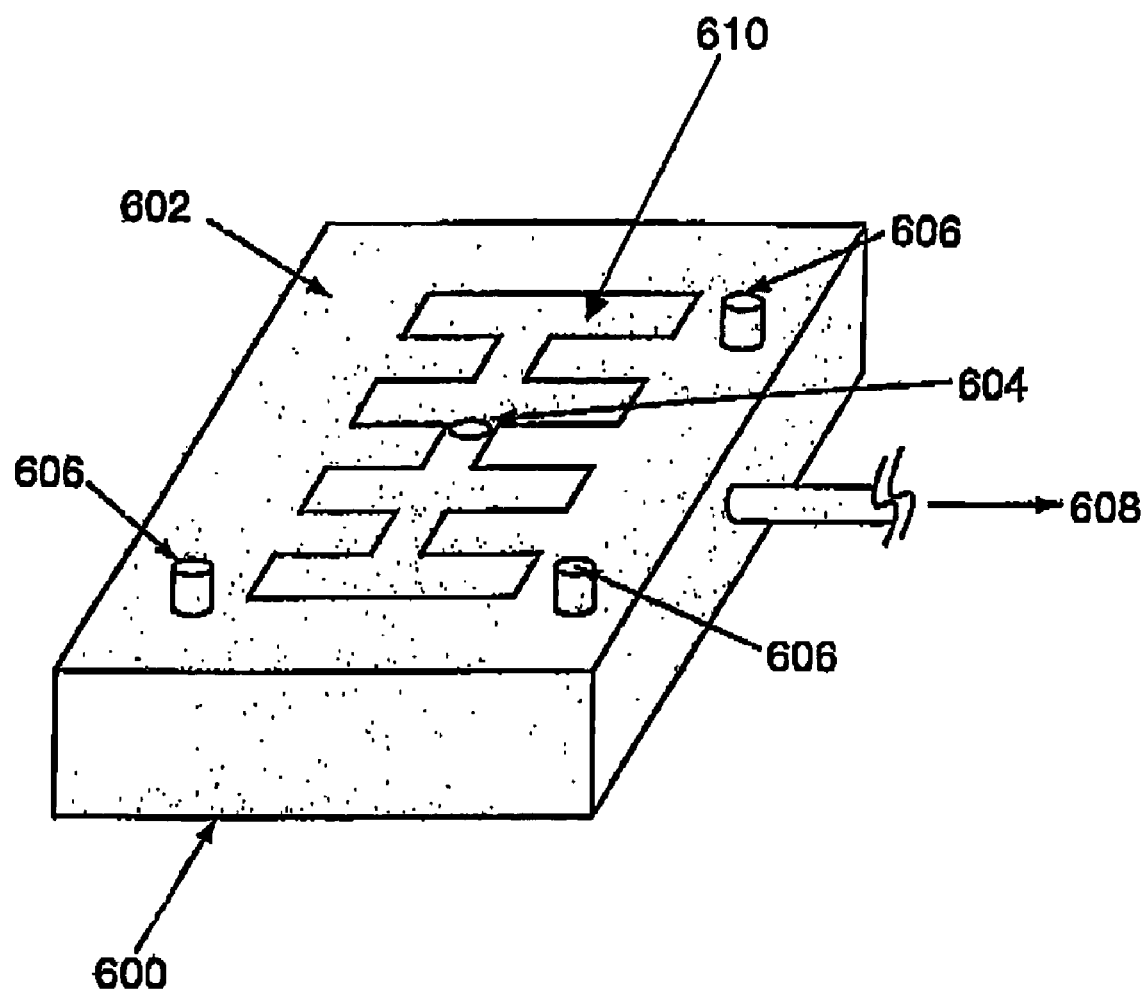
FIG. 6 schematically illustrates a mounting table and vacuum chuck for bonding substrates together.

One example of an apparatus for use in accordance with the methods described herein is shown in FIG. 6. As shown, the apparatus includes mounting table 600, which includes platform surface 602, having vacuum port 604 disposed therethrough. In operation, the top substrate (not shown), e.g., having the plurality of ports or holes disposed therethrough, is placed upon the platform surface and maintained in contact with that surface by virtue of the application of a vacuum through vacuum port 604. The platform also typically includes one or more alignment structures (e.g., alignment pins 606, alignment ridges, walls, wells, or the like) to ensure alignment of the substrates in the appropriate position, e.g., over vacuum port 604, as well as aligning the individual substrate portions with other substrate portions. In addition to such structures, alignment is also optionally facilitated by providing the platform at an appropriate angle, such that gravity will maintain the substrate in contact with the alignment structures. Vacuum port 604 is disposed through the platform surface and mounting table, and is connected via a vacuum line 608 to a vacuum source (not shown), e.g., a vacuum pump. For additional details, see, e.g., U.S. Pat. No. 5,882,465 to McReynolds, above, which is incorporated herein by reference in its entirety for all purposes.

Although not shown in FIG. 6, the top or second substrate is placed upon platform surface 602 such that the planar surface of the top substrate faces away from platform surface 602 of mounting table 600, and such that the holes or ports in the substrate are in communication with vacuum port 604 in platform surface 602 of mounting table 600. As mentioned, alignment of the holes over vacuum port 604 is typically accomplished through the incorporation of one or more alignment structures upon platform surface 602. In order to apply vacuum simultaneously at a plurality of the holes in the top substrate, a series of vacuum ports are optionally provided through platform surface 602. Preferably, however, platform surface 602 comprises a series of grooves 610 fabricated therein, and extending outward from one vacuum port 604, such that each of the plurality of holes in the top substrate will be in communication with vacuum port 604 via at least one of these "vacuum passages" (i.e., grooves 610) when the top substrate is placed upon platform surface 602.

The bottom substrate (not shown in FIG. 6), also having a first planar surface, is then placed on the top substrate such that the first planar surface of the bottom substrate mates with that of the top substrate. As mentioned, a wicking agent (e.g., water or the like) is also optionally placed between the substrate surfaces to assist in establishing optimal contact between the surfaces to be bonded. Again, the alignment structures present upon the platform surface typically operate to align the bottom substrate with the top substrate as well as maintain the substrates over vacuum port 604. The alignment of the various substrate portions relative to each other is particularly important in the manufacture of microfluidic devices, wherein each substrate portion typically includes microfabricated elements which are designed to be in fluid communication with other microfabricated elements on another substrate portion.

A vacuum is then applied through grooves 610 on platform surface 602, and to the holes through the top substrate. This acts to pull the two substrates together by evacuating the air between their planar surfaces. Specifically, upon mating the top substrate with the bottom substrate, the holes disposed through the top substrate will generally be in communication with the intersecting channel structures fabricated into the planar surface of the bottom substrate. However, the holes will not communicate with venting elements fabricated into the substrates. In these methods, the channel networks enhance the efficiency of the bonding process. For example, these channel networks typically cover large areas of the surface of the bottom substrate, or the space between the two substrates. As such, they typically enhance the efficiency with which air, wicking agent, or the like are evacuated from this space between the two substrates, which is critical to the bonding process. Again, although described in terms of ports fabricated in one substrate and channels fabricated in the other, it will be appreciated that ports and channels are optionally fabricated in the same substrate and/or in both substrates.

In addition to more efficiently removing air, wicking agent, etc. from between the substrates, the application of vacuum at each of the plurality of holes in the top substrate, as well as through the intersecting channel structures between the two substrates results in a more even application of the pressure forcing the substrates together. Specifically, unevenly applied pressures in bonding methods typically have substantial adverse effects on the bonding process. For example, uneven application of pressures on the two substrates during the bonding process typically results in uneven contact (i.e., bond voids) between the two surfaces of the two substrates, which, as described above, reduces the efficiency and quality, as well as the effective product yield of the bonding process.

Further, even where substrates are completely bonded under such uneven pressure, e.g., for thermally bonded polymeric substrates or substrates bonded with adhesives, such uneven pressures typically result in variations in the dimensions of the internal structures of the device from one location in a microfabricated device to another. Again, the channel networks extending across wide areas of the interior portion of the two substrates, e.g., fabricated into the surface of the second substrate, allows application of vacuum across a substantially larger, and more evenly distributed area of the interior portion of the substrates. Furthermore, although not directly affected by the application of vacuum, venting elements, as discussed, serve to prevent bond voids that do form from impacting the channel networks.

In addition to a vacuum chuck, bonding systems also optionally include a heat source, e.g., a controllable heat source such as a heat gun, for elevating the temperature of the top and bottom substrates while they are mounted on the platform surface/mounting table. For bonding silica-based substrates, this optional heat source applies an elevated temperature to the two substrates to create a preliminary bond between the substrates, so that they may be readily transferred to an annealing oven without the substrates shifting substantially relative to each other. This is generally accomplished by heating the two substrates to between about 90° C. and about 200° C. In the case of polymeric substrates, this heat source typically takes the place of the annealing oven by elevating the temperature of the polymeric substrates to appropriate bonding temperatures, e.g., between about 80° C. and 200° C. Further, this is optionally done while the substrates are mounted upon the mounting table, and while a vacuum is being applied to the substrates. As mentioned, this has the effect of maintaining an even, constant pressure on the substrates throughout the bonding process. Following such initial bonding, the substrates are transferred to an annealing oven, e.g., as described above, where they are subjected to bonding temperatures between about 500° C. and 1400° C., again, as described above.

It will be readily appreciated that the heat source portion of the apparatus optionally includes multiple heat sources, i.e., heat guns, or optionally includes heating elements integrated into the apparatus itself. For example, a thermoelectric heater is optionally fabricated into or placed in thermal contact with the platform surface/mounting table, which itself, is optionally fabricated from a thermally conductive material. Such thermal bonding systems are equally applicable to both polymeric substrates and silica-based substrates, e.g., for overall bonding of polymeric substrates, or for producing the initial, preliminary bonding of the silica-based substrates.

Alternate bonding systems for incorporation with the apparatus described herein include, e.g., adhesive dispensing systems, for applying adhesive layers between the two planar surfaces of the substrates. This is optionally done by applying the adhesive layer prior to mating the substrates, or by placing an amount of the adhesive at one edge of the adjoining substrates, and allowing the wicking action of the two mated substrates to draw the adhesive across the space between the two substrates.

In certain embodiments, the overall bonding system optionally includes automatable systems for placing the top and bottom substrates on the mounting surface and aligning them for subsequent bonding. Typically, such systems include translation systems for moving either the mounting surface or one or more of the top and bottom substrates relative to each other. For example, robotic systems are optionally used to lift, translate and place each of the top and bottom substrates upon the mounting table, and within the alignment structures, in turn. Following the bonding process, such systems also optionally remove the finished product from the mounting surface and transfer these mated substrates to a subsequent operation, e.g., separation operation, annealing oven for silica-based substrates, etc., prior to placing additional substrates thereon for bonding.

Many applications performed in or by the devices of the present invention are temperature dependent. In the context of microfluidics, for example, one temperature control technique entails resistively or Joule heating fluidic materials within microfluidic devices by flowing current through electrodes or other conductive components positioned, e.g., within a microchannel or other device cavity. The resulting flow of current into fluid within the cavities of a device resistively heats the fluid by dissipating energy through the electrical resistance of the fluid.

Specific microfluidic applications that involve resistive heating include nucleic acid amplification methods, such as the widely-known polymerase chain reaction (PCR). The PCR typically includes repeated thermocycles that denature double-stranded target nucleic acids, hybridize single-stranded target and primer nucleic acids, and elongate primer strands with a polymerase. Many variations of this basic technique are also known, including asymmetric PCRs, assembly PCRs, reverse transcription PCRs (RT-PCRs), ligase chain reactions (LCRs), or the like. Amplification methods, such as these, are described further in, e.g., F. M. Ausubel et al., eds., *Current Protocols in Molecular Biology*, Current Protocols, a joint venture between Greene Publishing Associates, Inc. and John Wiley & Sons, Inc. (supplemented through 2000), Sambrook et al., *Molecular Cloning-A Laboratory Manual* ($2^{nd}$ Ed.), Vol. 1-3, Cold Spring Harbor Laboratory, Cold Spring Harbor, N.Y. (1989), Newton and Graham, *PCR* ($2^{nd}$ Ed.), Scientific Publishers, Oxford, England (1997), Herrington and O'Leary, eds., *PCR 3: In Situ Hybridization*, IRL Press at Oxford University Press, Inc., Oxford, England (1997), Smeltzer, ed., *PCR In Bioanalysis: Methods in Molecular Biology*, Vol. 92, Humana Press, Towata, N.J. (1998), and Innis et al., eds., *PCR Strategies*, Academic Press, San Diego, Calif. (1995).

Nucleic acid sequencing or genotyping techniques, such as the Sanger dideoxy method, which is generally known in the art, are also optionally performed using the microfluidic devices and methods of providing resistive heat in the present invention. The dideoxy method typically includes performing repeated thermocycles to extend primers hybridized to single-stranded target nucleic acids with a polymerase (e.g., Taq DNA polymerase) in reaction mixtures that also include the four dNTPs, and one of the four dideoxy analogues (e.g., a 2',3'-dideoxy analog), which terminates the extension reaction upon incorporation. Sequences are typically determined by detecting signals, e.g., from radioactive or fluorescent labels incorporated into the extended primer strands. Sequencing formats, including cycle sequencing are described in a variety of references, including, e.g., Rapley, *PCR Sequencing Protocols*, Humana Press, Towata, N.J. (1996), Griffin and Griffin, Eds., *DNA Sequencing Protocols*, Humana Press, Towata, N.J. (1993), Roe et al., *DNA Isolation and Sequencing*, John Wiley & Sons, New York, N.Y. (1996), Adams et al., Eds., *Automated DNA Sequencing and Analysis*, Academic Press, San Diego, Calif. (1994), and Alphey, *DNA Sequencing from Experimental Methods to Bioinformatics*, Springer Verlag, New York, N.Y. (1997). See also, Maxam and Gilbert (1977) "A New Method for Sequencing DNA," *Proc. Natl. Acad. Sci. U.S.A.* 74:560-564 and Sanger et al. (1977) "DNA Sequencing with Chain-Terminating Inhibitors," *Proc. Natl. Acad. Sci. U.S.A.* 74:5463-5467. Applications of sequencing and other techniques in microfluidic systems are found in, e.g., published PCT applications WO 98/45481, WO 00/50172, and WO 00/50642.

Although, nucleic acid amplification and sequencing are discussed above for purposes of illustration, it will be appreciated that the resistively heating microfluidic cavities is optionally used for essentially any other application or assay in which temperature control is desired.

Figure 7:
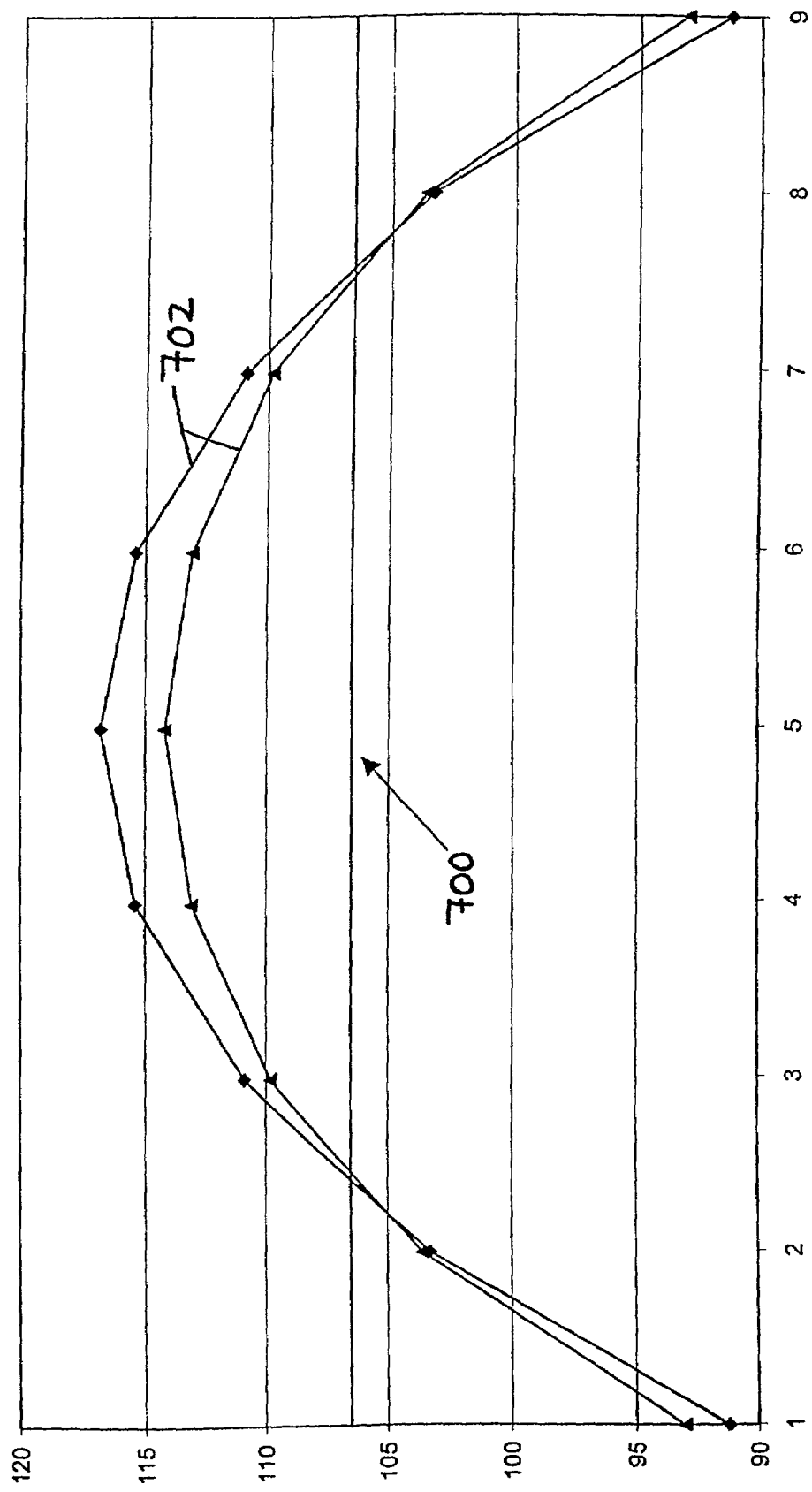
FIG. 7 is a data graph showing results of microfluidic resistive heating simulations.

To increase throughput, multiple reactions are optionally performed simultaneously in parallel reaction channels of a particular device. In these applications, it is typically desirable to achieve temperature uniformity across the multiple heated channels and also to reduce the power requirements to maintain temperatures within the device above the ambient temperature. In microfluidic devices that lack venting elements, there may be significant amounts of heat lost to the substrate material, which results in temperature distributions between channels. This is illustrated in FIG. 7, which provides a data graph that shows the results of steady resistive heating simulations performed in a device modeled to include nine parallel channels. Neighboring channels of the modeled device were separated by 250 μm from one another. The modeled device also included a 22C isothermal lower surface or bottom and the applied voltage was 2000V. Temperature (°C.) is indicated on the abscissa, while the particular channel number is provided on the ordinate. Average temperature 700 was between about 106° C. and 107° C. As shown, individual channel temperatures 702 varied by as much as about 25° C. in the simulations. Such temperature variation would be unacceptable, e.g., for PCR applications since tight temperature control is generally necessary in order to maintain reaction specificity.

The largest temperature variations are typically projected at the outermost channels of a given device, as they lack channels adjacent to their outer edges with which to couple, and as a consequence, dissipate heat into larger regions of open substrate, e.g., portions of the substrate lacking channels disposed therein. In preferred aspects, the invention provides insulating venting elements, such as voids, cavities, channels, or the like disposed proximal to at least these outermost channel edges, thereby gaining substantial uniformity of temperature over the full range of channels. As used herein, "substantial uniformity" refers to temperatures that vary by, e.g., less than about 30%, less than about 20%, less than about 10%, or less than about 5%, or less from one channel to any other channel in a particular device. For example, substantially uniform temperatures typically vary by, e.g., less than about 10° C., less than about 5° C., less than about 2° C., or less. In certain aspects, insulating venting elements may be provided only at these outermost edges and not between the heated channels, so as to allow the various heated channels to be thermally coupled, thereby potentially reducing the energy requirements of the system.

Figure 8:
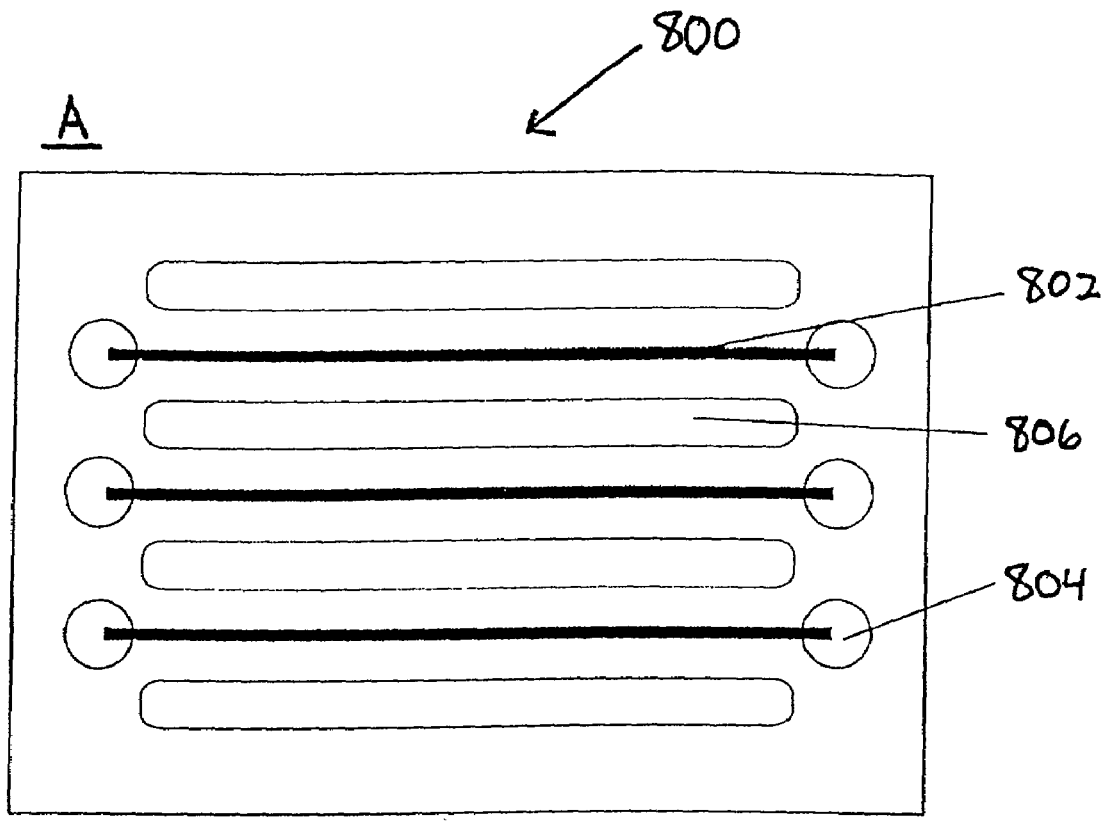
FIG. 8A schematically depicts a top view of a microfluidic device having venting elements disposed to either side of each of three parallel channels disposed therein.
FIG. 8B schematically illustrates a cross-sectional view of the device schematically depicted in FIG. 8A.
Figure 8:
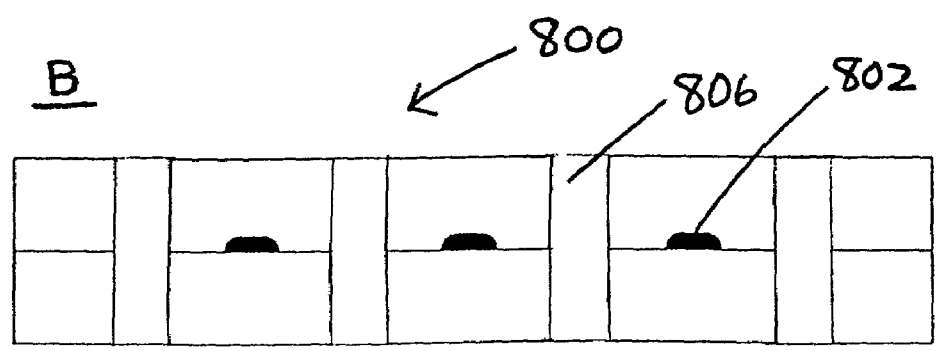

In the present invention, venting elements are optionally fabricated to provide discontinuous changes in the thermal conductivity of the particular substrate material to reduce the lateral flow of heat. In particular, a venting element forms an airgap that provides a significant barrier to heat transfer between regions in the device. For example, an air gap will thermally insulate and reduce thermal coupling between two heated channels. This is illustrated in FIG. 8A, which schematically depicts a top view of microfluidic device 800. As shown, microfluidic device 800 includes parallel channels 802, each of which fluidly communicates with two ports 804. As also shown, parallel channels 802, each include venting elements 806 disposed to either side to reduce the thermal coupling between parallel channels 802, which permits, e.g., independent temperature control of each channel 802. As depicted, venting elements 806 are disposed completely through microfluidic device 800. FIG. 8B schematically illustrates a cross-sectional view of microfluidic device 800. Although not shown, venting elements 806 are optionally disposed only partially through or completely within microfluidic device 800. Optionally, venting elements are used to thermally insulate multiple cavities or channels in a selected region or zone of a device, e.g., to maintain the cavities in the selected region at a selected temperature and to reduce thermal interference with other zones.

In certain aspects, it is preferred that the venting elements are disposed partially through the microfluidic device. In particular, it is often desirable to fabricate venting elements, e.g., thermal insulating elements or void venting elements using the same processes used to fabricate the channels within the microfluidic device, e.g., photolithography/wet chemical etching, injection molding, embossing, etc. As such, the various non-channel venting elements will appear very similar to the operative channels of the device (e.g., fluid conduits). In certain aspects, better thermal insulation may be achieved by providing such insulating channels deeper than the fluid channels of the device to provide optimal thermal insulation, or as provided above, providing such elements disposed entirely through at least one of the substrates of the device.

In certain embodiments, for example, the venting element is disposed in the body structure and produces a stagnant vapor region that reduces convective transport between venting element surfaces. In embodiments where the venting element is disposed at least partially through the body structure, at least one surface of the body structure optionally further includes at least one substrate disposed over (e.g., bonded as described above) at least a segment of the venting element to produce a stagnant vapor region that reduces convective transport between venting element surfaces.

In addition to the temperature control advantages provided by insulating different portions of a given device from one another, the total amount of power used to heat a channel is reduced, because less of the device is heated to maintain a selected temperature. Furthermore, venting elements also enhance heat removal in the vertical direction. Optionally, an active cooling element, such as a cooling fan, a cooled heat sink, a peltier cooler, or the like, is used to further enhance the vertical removal of heat from the device.

Although the methods and devices of the present invention are optionally applied to any process in which specific substrate regions are to be protected from the impact of bond voids, in preferred embodiments, the invention relates to the fabrication of microfluidic devices. As a result, this disclosure emphasizes the microfluidic applications of the present invention.

As used herein, the term "microscale" or "microfabricated" generally refers to structural elements or features of a device which have at least one fabricated dimension in the range of from about 0.1 μm to about 500 μm. Thus, a device referred to as being microfabricated or microscale will include at least one structural element or feature having such a dimension. When used to describe a fluidic element, such as a channel, passage, chamber or conduit, the terms "microscale," "microfabricated" or "microfluidic" generally refer to one or more fluid channels, passages, chambers or conduits which have at least one internal cross-sectional dimension, e.g., depth, width, length, diameter, etc., that is less than 500 μm, and typically between about 0.1 μm and about 500 μm.

In the devices of the present invention, the microscale channels or chambers preferably have at least one cross-sectional dimension between about 0.1 μm and 200 μm, more preferably between about 0.1 μm and 100 μm, and often between about 0.1 μm and 50 μm. Accordingly, the microfluidic devices or systems prepared in accordance with the present invention typically include at least one microscale channel, usually at least two intersecting microscale channels, and often, three or more intersecting channels disposed within a single body structure. Channel intersections optionally exist in a number of formats, including cross intersections, "Y" and/or "T" intersections, or any number of other structures whereby two channels are in fluid communication.

The manufacture of many different microscale systems is optionally adapted in accordance with the methods and devices of the present invention by, e.g., incorporating venting cavities, venting channels, frame channels, or the like, into pre-assembled substrate surfaces, as discussed below. These systems are described in numerous publications by the inventors and their coworkers. These include certain issued U.S. Patents, including U.S. Pat. No. 5,699,157 (J. Wallace Parce) issued Dec. 16, 1997, U.S. Pat. No. 5,779,868 (J. Wallace Parce et al.) issued Jul. 14, 1998, U.S. Pat. No. 5,800,690 (Calvin Y. H. Chow et al.) issued Sep. 1, 1998, U.S. Pat. No. 5,842,787 (Anne R. Kopf-Sill et al.) issued Dec. 1, 1998, U.S. Pat. No. 5,852,495 (J. Wallace Parce) issued Dec. 22, 1998, U.S. Pat. No. 5,869,004 (J. Wallace Parce et al.) issued Feb. 9, 1999, U.S. Pat. No. 5,876,675 (Colin B. Kennedy) issued Mar. 2, 1999, U.S. Pat. No. 5,880,071 (J. Wallace Parce et al.) issued Mar. 9, 1999, U.S. Pat. No. 5,882,465 (Richard J. McReynolds) issued Mar. 16, 1999, U.S. Pat. No. 5,885,470 (J. Wallace Parce et al.) issued Mar. 23, 1999, U.S. Pat. No. 5,942,443 (J. Wallace Parce et al.) issued Aug. 24, 1999, U.S. Pat. No. 5,948,227 (Robert S. Dubrow) issued Sep. 7, 1999, U.S. Pat. No. 5,955,028 (Calvin Y. H. Chow) issued Sep. 21, 1999, U.S. Pat. No. 5,957,579 (Anne R. Kopf-Sill et al.) issued Sep. 28, 1999, U.S. Pat. No. 5,958,203 (J. Wallace Parce et al.) issued Sep. 28, 1999, U.S. Pat. No. 5,958,694 (Theo T. Nikiforov) issued Sep. 28, 1999, U.S. Pat. No. 5,959,291 (Morten J. Jensen) issued Sep. 28, 1999, U.S. Pat. No. 5,964,995 (Theo T. Nikiforov et al.) issued Oct. 12, 1999, U.S. Pat. No. 5,965,001 (Calvin Y. H. Chow et al.) issued Oct. 12, 1999, U.S. Pat. No. 5,965,410 (Calvin Y. H. Chow et al.) issued Oct. 12, 1999, U.S. Pat. No. 5,972,187 (J. Wallace Parce et al.) issued Oct. 26, 1999, U.S. Pat. No. 5,976,336 (Robert S. Dubrow et al.) issued Nov. 2, 1999, U.S. Pat. No. 5,989,402 (Calvin Y. H. Chow et al.) issued Nov. 23, 1999, U.S. Pat. No. 6,001,231 (Anne R. Kopf-Sill) issued Dec. 14, 1999, U.S. Pat. No. 6,011,252 (Morten J. Jensen) issued Jan. 4, 2000, U.S. Pat. No. 6,012,902 (J. Wallace Parce) issued Jan. 11, 2000, U.S. Pat. No. 6,042,709 (J. Wallace Parce et al.) issued Mar. 28, 2000, U.S. Pat. No. 6,042,710 (Robert S. Dubrow) issued Mar. 28, 2000, U.S. Pat. No. 6,046,056 (J. Wallace Parce et al.) issued Apr. 4, 2000, U.S. Pat. No. 6,048,498 (Colin B. Kennedy) issued Apr. 11, 2000, U.S. Pat. No. 6,068,752 (Robert S. Dubrow et al.) issued May 30, 2000, U.S. Pat. No. 6,071,478 (Calvin Y. H. Chow) issued Jun. 6, 2000, U.S. Pat. No. 6,074,725 (Colin B. Kennedy) issued Jun. 13, 2000, U.S. Pat. No. 6,080,295 (J. Wallace Parce et al.) issued Jun. 27, 2000, U.S. Pat. No. 6,086,740 (Colin B. Kennedy) issued Jul. 11, 2000, U.S. Pat. No. 6,086,825 (Steven A. Sundberg et al.) issued Jul. 11, 2000, U.S. Pat. No. 6,090,251 (Steven A. Sundberg et al.) issued Jul. 18, 2000, U.S. Pat. No. 6,100,541 (Robert Nagle et al.) issued Aug. 8, 2000, U.S. Pat. No. 6,107,044 (Theo T. Nikiforov) issued Aug. 22, 2000, U.S. Pat. No. 6,123,798 (Khushroo Gandhi et al.) issued Sep. 26, 2000, U.S. Pat. No. 6,129,826 (Theo T. Nikiforov et al.) issued Oct. 10, 2000, U.S. Pat. No. 6,132,685 (Joseph E. Kersco et al.) issued Oct. 17, 2000, U.S. Pat. No. 6,148,508 (Jeffrey A. Wolk) issued Nov. 21, 2000, U.S. Pat. No. 6,149,787 (Andrea W. Chow et al.) issued Nov. 21, 2000, U.S. Pat. No. 6,149,870 (J. Wallace Parce et al.) issued Nov. 21, 2000, U.S. Pat. No. 6,150,119 (Anne R. Kopf-Sill et al.) issued Nov. 21, 2000, U.S. Pat. No. 6,150,180 (J. Wallace Parce et al.) issued Nov. 21, 2000, U.S. Pat. No. 6,153,073 (Robert S. Dubrow et al.) issued Nov. 28, 2000, U.S. Pat. No. 6,156,181 (J. Wallace Parce et al.) issued Dec. 5, 2000, U.S. Pat. No. 6,167,910 (Calvin Y. H. Chow) issued Jan. 2, 2001, U.S. Pat. No. 6,171,067 (J. Wallace Parce) issued Jan. 9, 2001, U.S. Pat. No. 6,171,850 (Robert Nagle et al.) issued Jan. 9, 2001, U.S. Pat. No. 6,172,353 (Morten J. Jensen) issued Jan. 9, 2001, U.S. Pat. No. 6,174,675 (Calvin Y. H. Chow et al.) issued Jan. 16, 2001, U.S. Pat. No. 6,182,733 (Richard J. McReynolds) issued Feb. 6, 2001, U.S. Pat. No. 6,186,660 (Anne R. Kopf-Sill et al.) issued Feb. 13, 2001, U.S. Pat. No. 6,221,226 (Anne R. Kopf-Sill) issued Apr. 24, 2001, U.S. Pat. No. 6,233,048 (J. Wallace Parce) issued May 15, 2001, U.S. Pat. No. 6,235,175 (Robert S. Dubrow et al.) issued May 22, 2001, U.S. Pat. No. 6,235,471 (Michael Knapp et al.) issued May 22, 2001, and U.S. Pat. No. 6,238,538 (J. Wallace Parce et al.) issued May 29, 2001.

These systems are also described in various PCT applications by the inventors including, e.g., WO 98/00231, WO 98/00705, WO 98/00707, WO 98/02728, WO 98/05424, WO 98/22811, WO 98/45481, WO 98/45929, WO 98/46438, and WO 98/49548, WO 98/55852, WO 98/56505, WO 98/56956, WO 99/00649, WO 99/10735, WO 99/12016, WO 99/16162, WO 99/19056, WO 99/19516, WO 99/29497, WO 99/31495, WO 99/34205, WO 99/43432, WO 99/44217, WO 99/56954, WO 99/64836, WO 99/64840, WO 99/64848, WO 99/67639, WO 00/07026, WO 00/09753, WO 00/10015, WO 00/21666, WO 00/22424, WO 00/26657, WO 00/42212, WO 00/43766, WO 00/45172, WO 00/46594, WO 00/50172, WO 00/50642, WO 00/58719, WO 00/60108, WO 00/70080, WO 00/70353, WO 00/72016, WO 00/73799, WO 00/78454, WO 01/02850, WO 01/14865, WO 01/17797, and WO 01/27253.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above may be used in various combinations. All publications, patents, patent applications, or other documents cited in this application are incorporated by reference in their entirety for all purposes to the same extent as if each individual publication, patent, patent application, or other document were individually indicated to be incorporated by reference for all purposes.

What is claimed is:

1. A fabrication element comprising a body structure that includes two substrates, the body structure having a microchannel network disposed therein and a venting channel disposed therein or at least partially therethrough, the microchannel network disposed within the body structure such that the microchannel network is covered by at least one of the two substrates, the microchannel network comprising a plurality of microchannels, at least two of which microchannels intersect, the venting channel disposed along at least a portion of a side of one or more of the microchannels such that it does not intersect with any microchannel in the microchannel network.

2. The fabrication element of claim 1, wherein the venting channel is disposed substantially parallel to one or more sides of the one or more microchannels in the microchannel network.

3. The fabrication element of claim 1, wherein the fabrication element further comprises a first venting channel network, the venting channel comprising a portion of the first venting channel network.

4. The fabrication element of claim 3, further comprising a second venting channel network, at least one venting channel of which is disposed proximal to a second side of the one or more microchannels in the microchannel network.

5. The fabrication element of claim 4, wherein the venting channel of the first venting channel network and the at least one venting channel of the second venting channel network are disposed substantially parallel to the one or more microchannels in the microchannel network.

6. The fabrication element of claim 4, wherein the venting channel of the first venting channel network and the at least one venting channel of the second venting channel network terminate at least about 0.05 mm from an edge of a port when the one or more microchannels in the microchannel network fluidly communicate with the port.

7. The fabrication element of claim 4, wherein the venting channel of the first venting channel network and the at least one venting channel of the second venting channel network each comprises a width of at least about 5 µm.

8. The fabrication element of claim 4, wherein two or more venting channels in the first or second venting channel networks merge in regions where cross-sectional midpoints of the two or more venting channels are separated by at most about 50 µm.

9. The fabrication element of claim 4, wherein cross-sectional midpoints of the venting channel of the first venting channel network and the at least one venting channel of the second venting channel network are each disposed at least about 60 µm from a cross-sectional midpoint of the one or more microchannels in the at least one microchannel network.

10. The fabrication element of claim 9, wherein the one or more microchannels comprise a width of at least about 60 µm.

11. The fabrication element of claim 4, wherein one or more edges of the body structure comprise at least a third venting channel network comprising one or more venting channels.

12. The fabrication element of claim 11, wherein the one or more venting channels comprise widths of at least about 0.1 mm.

13. The fabrication element of claim 11, wherein the one or more venting channels are disposed at least about 3 mm from the one or more edges of the body structure.

14. The fabrication element of claim 11, wherein one or more venting channels of the first and second venting channel networks fluidly communicate with the third venting channel network.

15. A fabrication element comprising a body structure formed by bonding together at least a first and a second substrate, at least one of the first and second substrates having a plurality of components disposed therein, the plurality of components including at least one venting channel network disposed within the body structure at the interface of the first and second substrates to vent bond voids between the bonded substrates, the venting channel network comprising at least two intersecting channels, the venting channel network disposed in at least one of the first and second substrates such that it does not intersect with any other component disposed in the first and second substrates.

* * * * *